United States Patent
Suzuki et al.

(10) Patent No.: US 9,544,988 B2
(45) Date of Patent: *Jan. 10, 2017

(54) BOILING REFRIGERANT TYPE COOLING SYSTEM

(71) Applicant: HITACHI, LTD., Tokyo (JP)

(72) Inventors: Kazuaki Suzuki, Hadano (JP); Shigemasa Sato, Hadano (JP); Akio Idei, Hadano (JP)

(73) Assignee: HITACHI, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/551,499

(22) Filed: Nov. 24, 2014

(65) Prior Publication Data

US 2015/0075200 A1    Mar. 19, 2015

Related U.S. Application Data

(63) Continuation of application No. 13/494,461, filed on Jun. 12, 2012, now Pat. No. 8,929,073.

(30) Foreign Application Priority Data

Jun. 13, 2011   (JP) ................................. 2011-131027

(51) Int. Cl.
| | |
|---|---|
| H05K 7/20 | (2006.01) |
| H05K 1/02 | (2006.01) |
| H01L 23/427 | (2006.01) |
| F25B 39/04 | (2006.01) |

(52) U.S. Cl.
CPC ............. *H05K 1/0201* (2013.01); *F25B 39/04* (2013.01); *H01L 23/427* (2013.01); *H05K 7/20318* (2013.01); *H01L 2924/0002* (2013.01)

(58) Field of Classification Search
USPC ........................ 361/676–678, 688–722, 752, 760–761,361/831
See application file for complete search history.

(56) References Cited

U.S. PATENT DOCUMENTS

| | | | |
|---|---|---|---|
| 4,729,155 A | | 3/1988 | Cunningham et al. |
| 5,761,037 A | * | 6/1998 | Anderson ........... F28D 15/0266 165/104.26 |
| 5,998,240 A | | 12/1999 | Hamilton et al. |
| 6,005,772 A | * | 12/1999 | Terao ................. F28D 15/0233 165/104.21 |

(Continued)

FOREIGN PATENT DOCUMENTS

| | | |
|---|---|---|
| JP | 52-014260 A | 2/1977 |
| JP | 06-104358 A | 4/1994 |

(Continued)

*Primary Examiner* — Courtney Smith
(74) *Attorney, Agent, or Firm* — Volpe and Koenig, P.C.

(57) ABSTRACT

A boiling refrigerant type cooling system to suppress overshoot upon start of heat generation and realize stable start of boiling. In the boiling refrigerant type cooling system, a metal boiling heat transfer unit has a base in thermal contact with a heat generating body. The boiling heat transfer unit is in contact with a liquid refrigerant. The boiling heat transfer unit has plural parallel tunnels communicating with the outside via holes or gaps under its surface, a groove deeper than a tunnel diameter formed through all the tunnels in an orthogonal direction to the tunnels, and a cover plate on the groove.

7 Claims, 10 Drawing Sheets

(56) References Cited

U.S. PATENT DOCUMENTS

| | | | |
|---|---|---|---|
| 6,082,443 A * | 7/2000 | Yamamoto | F28D 15/0233 |
| | | | 165/104.21 |
| 6,899,165 B1 * | 5/2005 | Wu | F28D 15/0233 |
| | | | 165/104.21 |
| 7,231,961 B2 | 6/2007 | Alex et al. | |
| 7,392,836 B2 * | 7/2008 | Wong | F28D 15/0233 |
| | | | 165/104.26 |
| 7,515,415 B2 | 4/2009 | Monfarad et al. | |
| 7,604,040 B2 * | 10/2009 | Ghosh | H01L 23/473 |
| | | | 165/104.33 |
| 7,755,895 B2 * | 7/2010 | Ikeda | H01L 23/36 |
| | | | 165/185 |
| 7,911,794 B2 | 3/2011 | Hasegawa | |
| 8,100,170 B2 * | 1/2012 | Huang | F21V 29/20 |
| | | | 165/104.26 |
| 2006/0071326 A1 | 4/2006 | Chrysler et al. | |
| 2007/0002541 A1 * | 1/2007 | Chang | H01L 23/427 |
| | | | 361/704 |
| 2008/0236797 A1 | 10/2008 | Miyazaki et al. | |
| 2010/0073865 A1 | 3/2010 | Hayashi et al. | |
| 2010/0073866 A1 | 3/2010 | Toyoda et al. | |
| 2011/0048676 A1 * | 3/2011 | Toyoda | F28D 1/05366 |
| | | | 165/104.21 |
| 2012/0180993 A1 | 7/2012 | Yoshikawa | |

FOREIGN PATENT DOCUMENTS

| | | |
|---|---|---|
| JP | 07-066339 A | 3/1995 |
| JP | 2001-077256 A | 3/2001 |
| JP | 2005-164126 A | 6/2005 |
| JP | 2008-147482 A | 6/2008 |
| JP | 2008-177257 A | 7/2008 |
| JP | 2010-079401 A | 4/2010 |
| JP | 2010-079402 A | 4/2010 |
| JP | 2010-079403 A | 4/2010 |
| JP | 2010-079404 A | 4/2010 |
| JP | 2010-079406 A | 4/2010 |
| JP | 2010-080506 A | 4/2010 |
| JP | 2011-047616 A | 3/2011 |
| JP | 2011-220596 A | 11/2011 |
| WO | 2011040129 A1 | 4/2011 |

* cited by examiner

BUBBLE ORIGINATING POINT 602

601 ADDED TUNNEL

603 SPREAD OF STEAM LAYER

BOILING REFRIGERANT TYPE COOLING SYSTEM 700

COOLING FAN 708

STEAM PIPE 705

709 STEAM FLOW

707 CONDENSER

HEAT RECEPTION JACKET 703

BUBBLE 711

FLOW OF RETURN LIQUID 710

LIQUID REFRIGERANT 704

706 LIQUID RETURN PIPE

702 HEAT GENERATING BODY

701 CIRCUIT BOARD

BOILING REFRIGERANT TYPE COOLING SYSTEM

INCORPORATION BY REFERENCE

The present application is a continuation of U.S. application Ser. No. 13/494,461, filed Jun. 12, 2012, which claims priority from Japanese application serial No. 2011-131027, filed on Jun. 13, 2011, the entire contents of which are hereby incorporated by reference into this application.

BACKGROUND OF THE INVENTION

The present invention relates to a boiling refrigerant type cooling system preferably applicable to cooling of a heat generating body such as a semiconductor device, and more particularly, to a boiling refrigerant type cooling system to realize stable start of boiling even with respect to a heat generating body with high heat generation density.

In recent years, a semiconductor device such as a central processing unit (CPU) incorporated in electronic devices such as a personal computer or a server has an increasing heat release value due to miniaturization and high integration. However, in the above-described semiconductor device, generally, its performance cannot be maintained at a temperature equal to or higher than a predetermined temperature, and further, the device may be broken in some cases. Accordingly, temperature management by cooling or the like is required. Generally, cooling is realized with an air cooling system using a heat sink and a fan to send air to the heat sink. However, localization of heat generating part occurs due to the above-described miniaturization and high integration. Further, reduction of electric power consumption in the electronic devices and noise reduction are required in recent ecology-conscious society.

From the above-described object and requirements, there is a strong request for an efficient cooling technology such as a liquid cooling system using a refrigerant such as water in place of conventional air cooling systems. Among the above-described liquid cooling systems, a boiling refrigerant type cooling system especially attracts attention. This system utilizes liquid boiling and latent heat of vaporization of the refrigerant to obtain high cooling efficiency.

Note that as a conventional technique related to the present invention, e.g., Patent Japanese Published Unexamined Patent Application Nos. 2011-47616, 2001-77256 and 2008-147482 disclose a cooling system, having a heat reception jacket which is thermally connected to a heat-generating semiconductor device or the like and which boils a contained liquid refrigerant, and a condenser which receives refrigerant steam from the heat reception jacket and condenses the steam to the liquid, to circulate the refrigerant by phase change.

Further, Japanese Published Unexamined Patent Application No. 2005-164126 discloses a technique to provide minute tunnels communicating with the outside via minute holes or gaps under a surface in contact with liquid on a boiling surface, to improve heat transfer performance of the boiling surface.

When a heat generating body is cooled using the above-described boiling refrigerant type cooling system, there is a problem of overshoot which occurs especially upon start of boiling. That is, as shown with a broken line in FIG. 1, the temperature of the boiling surface is increased to the start of boiling, then radically reduced after the start of boiling, and stabilized. The difference between the maximum temperature upon start of boiling and the temperature in stable boiling is overshoot. The overshoot occurs due to a similar phenomenon to bumping (explosive boiling phenomenon).

Even when heat generation and stoppage of heat generation of a heat generating body are repeated under the same external conditions, the level of overshoot and time from the start of heat generation to the start of boiling differ each time as shown in FIG. 2. Further, in some cases, boiling does not start even when several hours have elapsed from the start of heat generation. Accordingly, when a semiconductor device or the like is cooled using a boiling refrigerant type cooling system, it is necessary to completely suppress the above-described overshoot. When the overshoot occurs, there is a probability that the temperature is raised beyond a permissible limit of the semiconductor device to cause failure or breakage of the semiconductor device.

The above-described Patent Japanese Published Unexamined Patent Application Nos. 2011-47616, 2001-77256 and 2008-147482 disclose a technique to improve heat transfer performance by boiling, although they do not disclose a technique to suppress the overshoot.

To suppress the overshoot, it is necessary to provide a structure to promote generation of initial bubbles as a start of boiling upon start of heat generation. That is, it is necessary to suppress the occurrence of overshoot by inducing the generation of bubbles.

According to the structure in Japanese Published Unexamined Patent Application No. 2005-164126 shown in FIG. 3, when bubbles as a start of boiling occur, then the bubbles spread in the tunnels, and the tunnels are filled with a steam layer. Then as shown in FIG. 4, the steam layer comes into contact with the liquid through the minute holes or gaps, to realize continuous boiling.

However, when Japanese Published Unexamined Patent Application No. 2005-164126 is formed on a plane surface, as the respective tunnels are provided in parallel as shown in FIG. 5, when one bubble is generated somewhere, the steam layer is formed in merely one tunnel. Accordingly, to spread the steam layer over the entire boiling surface, it is necessary to cause many bubbles. However, as the bubbles are generated at random, it is impossible to suppress the unstableness upon start of boiling as shown in FIG. 2 with the structure in Japanese Published Unexamined Patent Application No. 2005-164126.

Further, to suppress the overshoot, it is necessary to provide a structure to prevent percolation of foreign material into the boiling surface, especially percolation of brazing material used in hard soldering into the boiling surface. Generally, the characteristic of boiling phenomenon is much influenced by wettability between the liquid and the material of the boiling surface, i.e., the contact angle. Generally, it is known that the boiling heat transfer performance is improved when the contact angle is small. When the contact angle is small, the liquid flows between the bubbles and the boiling surface, to reduce the respective bubbles and the steam layer having a low thermal conductivity is thinned. On the other hand, upon generation of initial bubbles as a start of boiling, as bubble growth is disturbed with the flow-in of the liquid when the contact angle is small, the start of boiling is stable when the contact angle is large. Accordingly, the percolation of foreign material such as brazing material with a smaller contact angle than that of the material of the boiling surface into the boiling surface becomes a factor of unstableness of start of boiling.

SUMMARY OF THE INVENTION

The present invention has been made in consideration of the above situation, and provides a boiling refrigerant type cooling system to suppress overshoot upon start of heat generation and realize stable start of boiling.

The present invention provides a boiling refrigerant type cooling system where a boiling heat transfer unit, having a metal base which is in thermal contact with a heat generating body, is in contact with a liquid refrigerant. The boiling heat transfer unit has plural tunnels communicating with the outside via holes or gaps formed in parallel under its surface. Further, the boiling heat transfer unit has a groove deeper than a tunnel diameter formed through all the tunnels in a direction orthogonal to the tunnels, and a cover plate on the groove.

In the boiling refrigerant type cooling system according to the present invention, since the thickness of the base in the groove is thinned by the groove added to the boiling heat transfer unit, the temperature of the base in the groove part is higher than its peripheral part, and bubble generation in the groove part is promoted. Further, when bubbles are generated in some point, all the tunnels of the boiling heat transfer surface are filled with steam trough the new tunnels formed with the groove and the cover plate. Thus it is possible to realize stable start of boiling upon start of heat generation.

DETAILED DESCRIPTION OF THE PREFERRED EMBODIMENTS

Hereinbelow, a preferred embodiment of the present invention will now be described in detail in accordance with the accompanying drawings. ps [First Embodiment]

Figure 7:
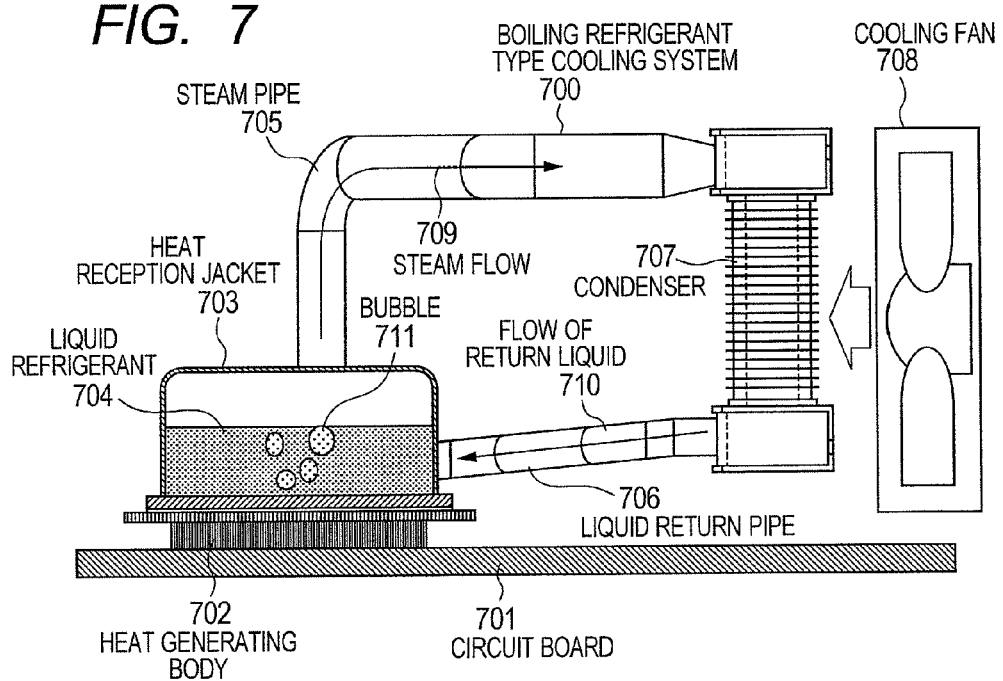
FIG. 7 is a cross-sectional diagram schematically showing the entire structure of the boiling refrigerant type cooling system utilizing a thermo siphon as an embodiment of the present invention.

FIG. 7 shows an entire structure of a boiling refrigerant type cooling system as an embodiment of the present invention. A heat generating body 702 such as a semiconductor device is provided on a circuit board 701. A heat reception jacket 703 having a boiling stabilizing structure according to the present invention is attached to the surface of the heat generating body 702. The heat generating body 702 and the heat reception jacket 703 are in thermal contact with each other. Further, a liquid refrigerant 704 is accommodated inside the heat reception jacket 703, and is connected to a condenser 707 via a steam pipe 705 and a liquid return pipe 706. Further, a cooling fan 708 is placed in a position to send cooling air to the condenser 707.

In the boiling refrigerant type cooling system 700 having the above structure, heat generated in the heat generating body 702 is transmitted to the heat reception jacket 703. The liquid refrigerant 704 is boiled with the transmitted heat and becomes steam. The generated steam flows through a steam pipe 705 as indicated with an arrow 709, and conducted to the condenser 707. The steam is cooled with the cooling air in the condenser 707, and condensed to liquid. The refrigerant in liquid state is returned through the liquid return pipe 706 by gravity to the heat reception jacket 703 as indicated with an arrow 710. As described above, the boiling refrigerant type cooling system 700 provides a so-called thermo siphon which circulates the liquid refrigerant 704 without external motive power source such as a conductive pump, with phase change of the liquid refrigerant 704 and gravity.

In the boiling refrigerant type cooling system 700, since heat is transferred with latent heat of the refrigerant as described above, when liquid having high latent heat such as water is adopted as a liquid refrigerant, high cooling efficiency can be obtained. Note that when cooling is performed at normal temperatures using water as a refrigerant, it is necessary to reduce pressure in the pipe forming the thermo siphon so as to lower the boiling point of the water. At this time, it is preferable that the heat reception jacket 703, the stem pipe 705, the liquid return pipe 706 and the condenser 707 are formed with metal such as copper having no corrosiveness to water. Further, it is preferable that the respective joint parts are brazed or welded. Further, when an organic refrigerant having a low boiling point such as hydrofluoroether is used as a refrigerant, it is not necessary to reduce pressure in the pipe. Accordingly, deformable material such as silicone tube or a rubber tube is used as the steam pipe and the condenser pipe, and the position of the condenser can be freely changed. Further, the refrigerant is not particularly limited as long as the material is boiled with heat transmitted from the heat generating body 702. In the present embodiment, water is adopted as a refrigerant, and copper is adopted as metal material of the other parts.

Figure 8:
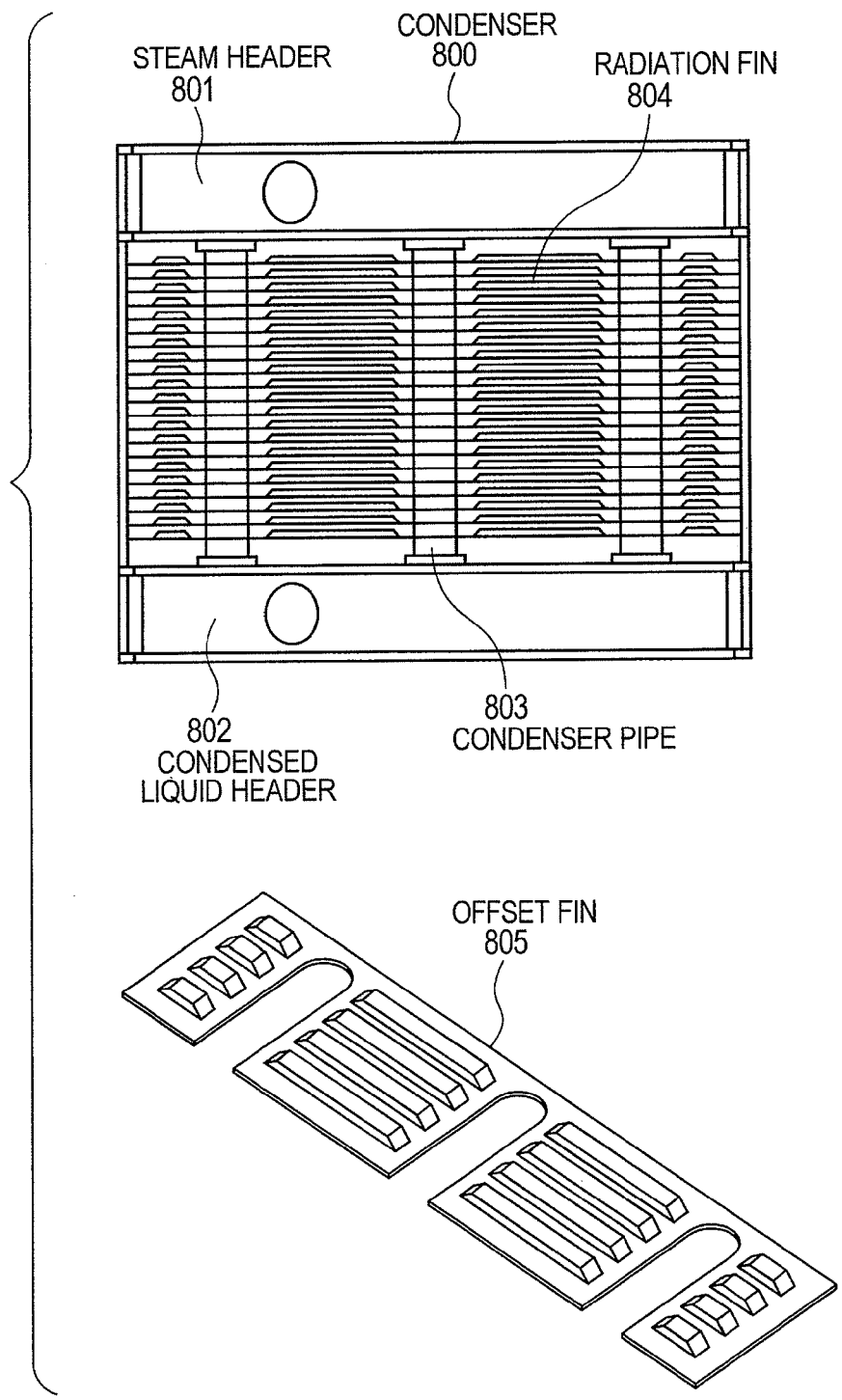
FIG. 8 is a front diagram and a perspective diagram showing a detailed structure of a condenser of the boiling refrigerator type cooling system.

The condenser 707 preferably has a structure, in which a pipe for passing steam is connected to a radiation fin, capable of efficient heat exchange. In the present embodiment, a structure shown in FIG. 8 is adopted. A condenser 800 has a steam header 801 to spread sent steam, a condensed liquid header 802 to store a condensed liquid refrigerant and a condenser pipe 803 connecting the both members, and a radiation fin 804 thermally connected to the condenser pipe 803. The steam header 801 and the condensed liquid header 802 are connected to the steam pipe 703 and the liquid return pipe 704. The steam sent to the condenser 800 is cooled and condensed when passed through the condenser pipe 803, and heat is transmitted through the radiation fin to the ambient air. In the present embodiment, an offset fin 805 is adopted as the radiation fin, to improve the volumetric efficiency of the radiation performance. The material of the condenser is preferably metal having excellent thermal conductivity such as copper or aluminum.

Figure 9:
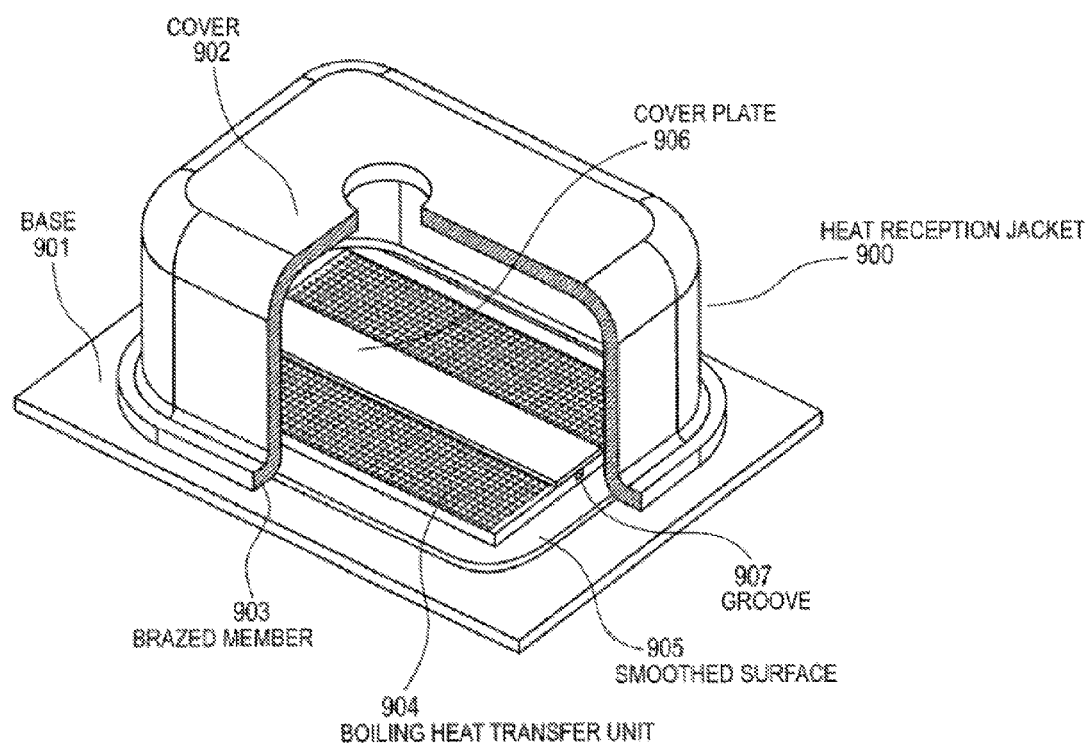
FIG. 9 is a perspective diagram including a partial cross section showing a detailed structure of a heat reception jacket forming the boiling refrigerator type cooling system.

FIG. 9 shows the structure of the heat reception jacket in the present embodiment. A heat reception jacket 900 is formed by placing a cover 902, formed by shaping metal such as copper or stainless steel in a cup shape, on a metal rectangular base 901 of, e.g., copper having excellent thermal conductivity, and connecting the lower part of the cover 902 to the base 901 by brazing using brazing material such as Ag72-Cu28 (BAg-8). Then, to lower the boiling point of water as a liquid refrigerant, the pressure inside the heat reception jacket is reduced. The cover 902 has through holes in its upper part and side surface respectively connected to the steam pipe 703 and the liquid return pipe 704. Then, the base 901 is machine-processed, thus a boiling heat transfer unit 904 according to the present invention is formed.

Further, as a factor to disturb occurrence of initial bubbles as a start of boiling, percolation of the brazing material in the boiling heat transfer unit 904 is given. Since the contact angle between the liquid refrigerant and the base material much influences the occurrence of bubbles, when the brazing material percolated in the boiling heat transfer unit 904 forms a partial film on the boiling surface, the contact angle between the refrigerant and the base is changed on the film, which disturbs the occurrence of bubbles. Accordingly, it is necessary to prevent percolation of the brazing material from a brazed member 903 of the heat reception jacket 900 into the boiling heat transfer unit 904.

In hard soldering, when the brazing material melted in a reactor percolates inside through gaps between minute concavities and convexities and grooves on the base by a capillary force, the percolation of the brazing material occurs. Accordingly, to solve the above problem, a smoothed surface 905 having surface roughness equal to or lower than 3.2 S (the maximum height from an average surface is 3.2 μm) is formed by performing end milling using a milling machine between the brazed member 903 and the boiling heat transfer unit 904.

Figure 14:
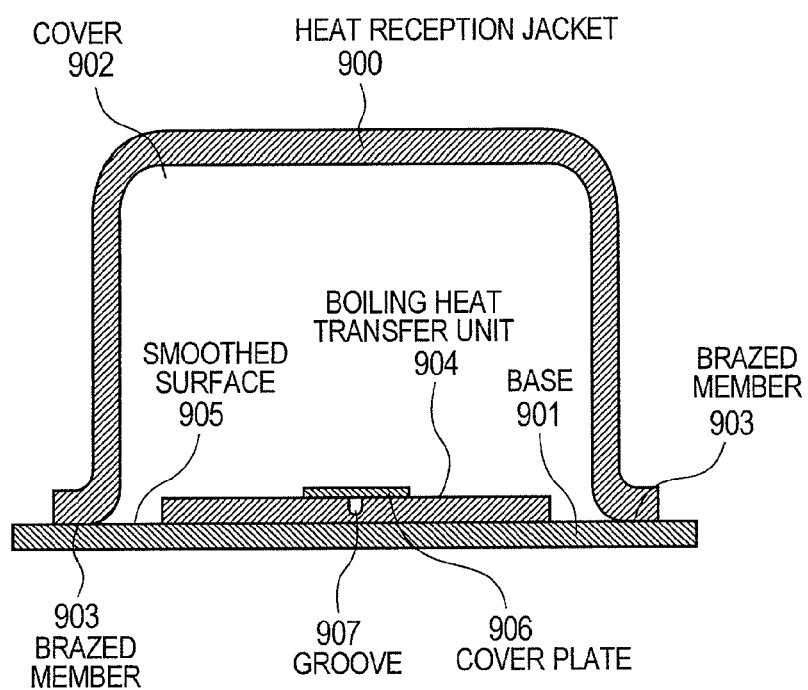
FIG. 14 is a cross-sectional diagram showing the detailed structure of the heat reception jacket.

FIG. 14 shows a cross section of the heat reception jacket 900. By the above additional processing, the brazing material forms a fillet shape in the brazed member 903 upon brazing, accordingly, the brazing material does not percolate in the heat reception jacket 900 from the brazed member 903.

Figure 10:
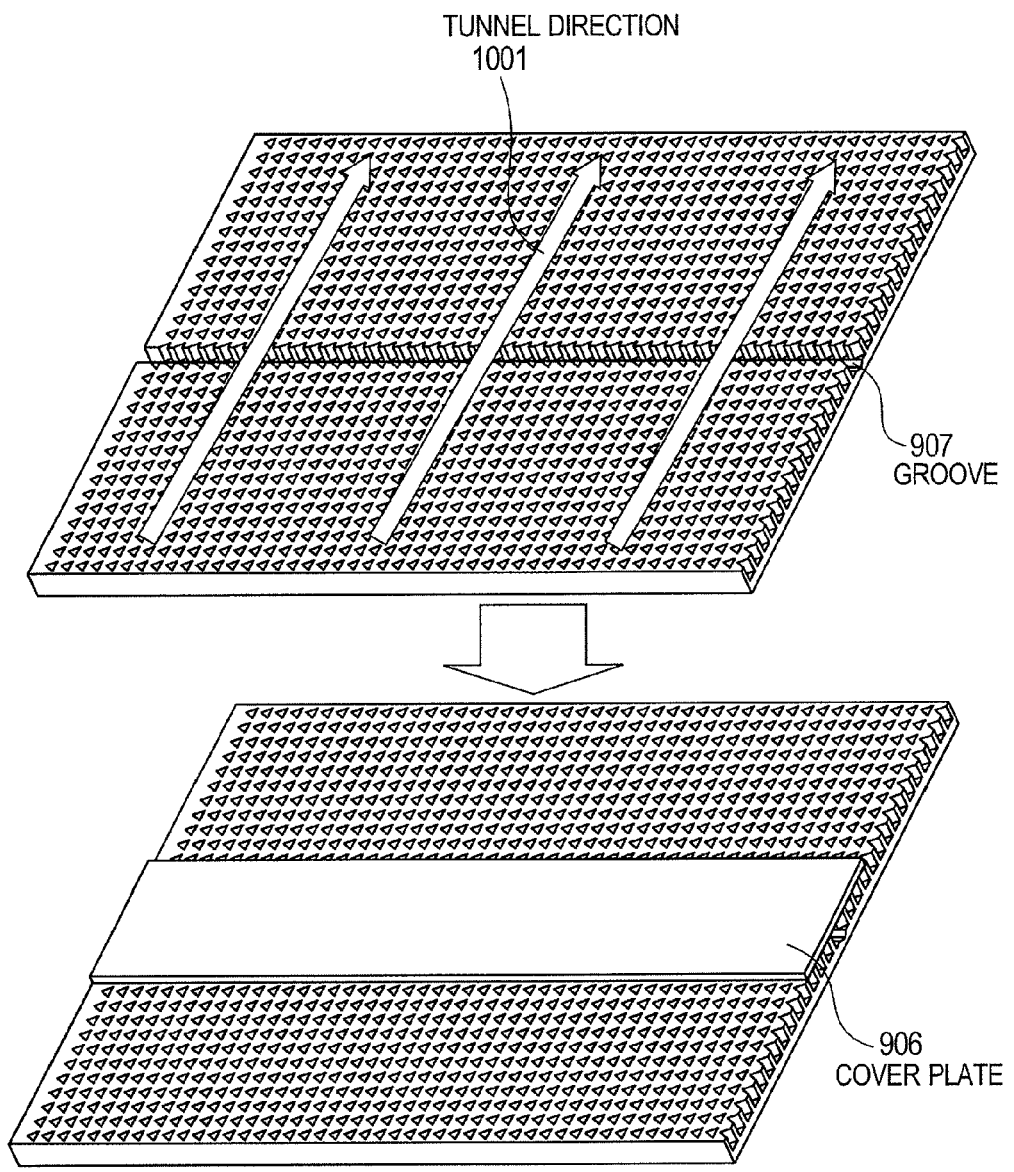
FIG. 10 is an enlarged perspective diagram showing a detailed structure of the boiling heat transfer surface of the heat reception jacket.

FIG. 10 shows the boiling heat transfer unit 904 according to the present invention. The boiling heat transfer surface of the unit has a minute tunnel structure 1001 communicating with the outside via minute holes on the side in contact with the refrigerant on the base 901 of the heat reception jacket 900. Further, the boiling heat transfer surface has a groove 907 having a width of 1 mm and a depth of 0.9 mm at the center of the boiling heat transfer unit 904. Further, a cover plate 906 of the same metal material as that of the base, having a thickness of 0.5 mm and a width of 8 mm, is placed on the groove by spot soldering. The cover plate 906 is provided to prevent ascent of the bubbles occurred in the groove 907 to the upper part and spread the bubbles in the tunnel structure 1001 extending from the groove 907. The width of the cover plate 906 is determined in accordance with relation between the spread of the bubbles in the tunnel structure 1001 and the ascent of the bubbles to the upper part.

Figure 1:
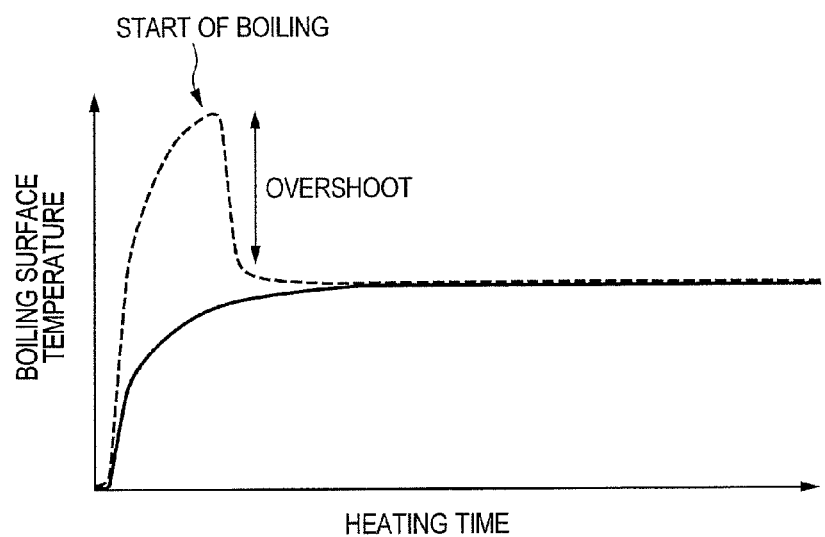
FIG. 1 is a graph explaining overshoot which occurs upon start of boiling in a boiling refrigerant type cooling system.
Figure 2:
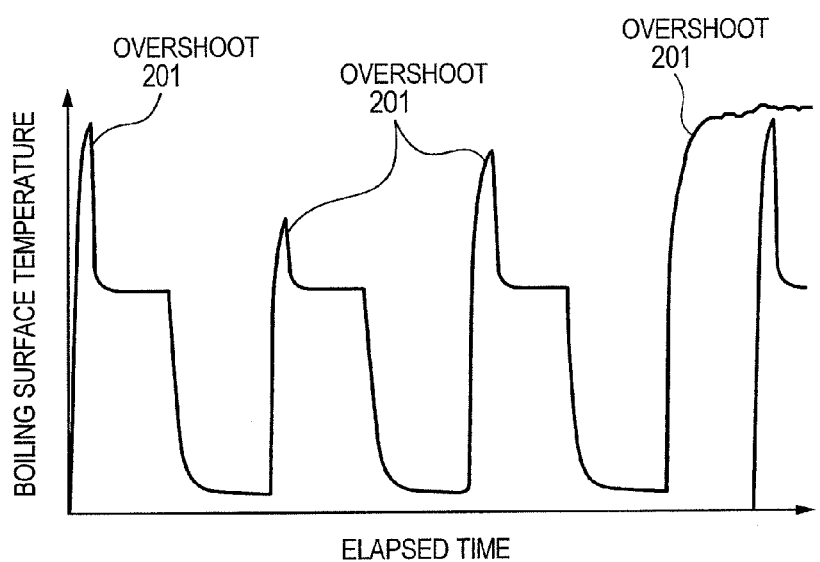
FIG. 2 is a graph showing unstable occurrence of the overshoot.
Figure 3:
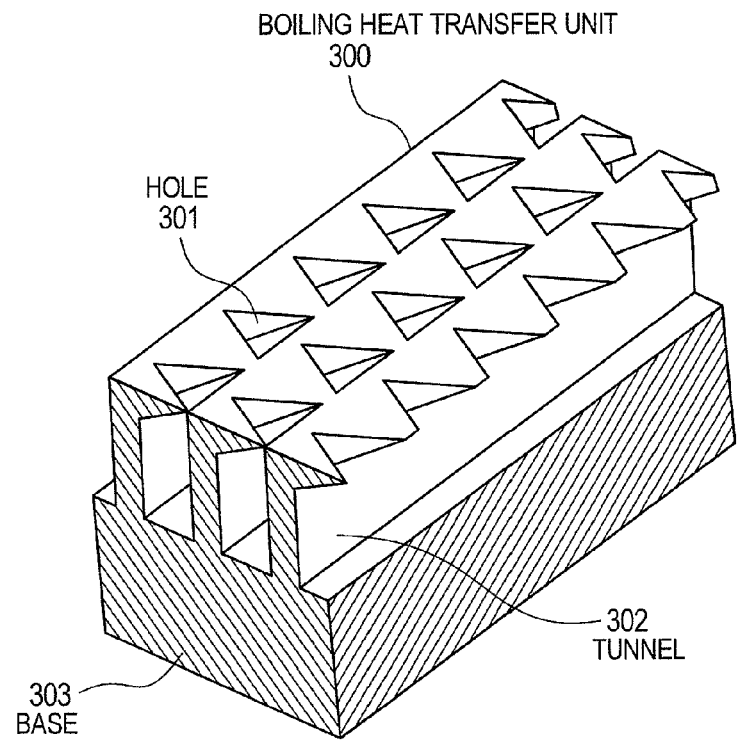
FIG. 3 is a perspective diagram of a boiling heat transfer structure according to the Japanese Published Unexamined Patent Application No. 2005-164126.
Figure 4:
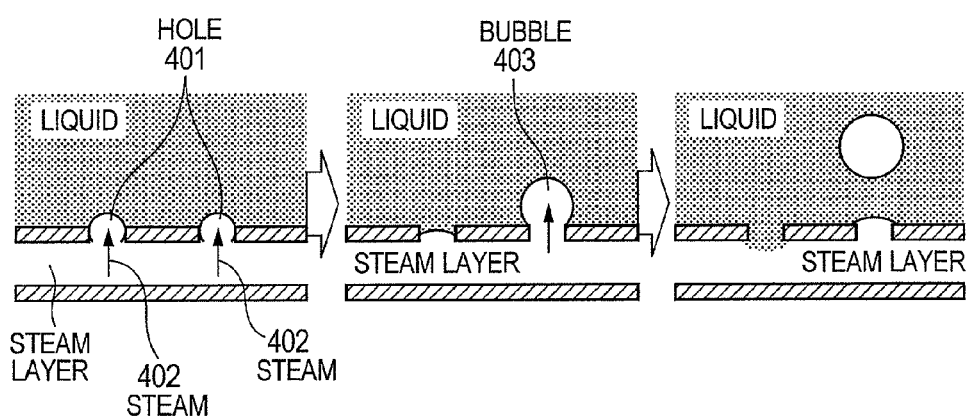
FIG. 4 is a cross-sectional diagram of a boiling heat transfer surface showing boiling according to Japanese Published Unexamined Patent Application No. 2005-164126.

FIG. 3 shows an enlarged view of the tunnel structure 1001. As described in the summary of the invention, upon occurrence of bubbles as the start of boiling in some point of the tunnel structure 1001, the bubbles spread within one line of tunnel 302, and in contact with the refrigerant through a hole 301. Thereafter, as shown in FIG. 4, it is possible to maintain continuous boiling state through the hole 301. At this time, the tunnel and the hole may have optimum diameter values in accordance with physical properties, especially surface tension, of the refrigerant. When the hole diameter is too large or the tunnel diameter is too small with respect to the surface tension of the refrigerant, a large amount of the cold refrigerant enters the tunnel. Then the steam in the tunnel is re-condensed, and the boiling may be stopped. Further, when the hole diameter is too small or the tunnel diameter is too large with respect to the surface tension of the refrigerant, the removal of the bubbles 403 from the boiling surface is not smoothly performed and the thermal conductive performance is lowered. In the present embodiment, optimization is performed on the water as the refrigerant, and the average hole diameter is 0.25 mm and the tunnel diameter is 0.8 mm.

Figure 11:
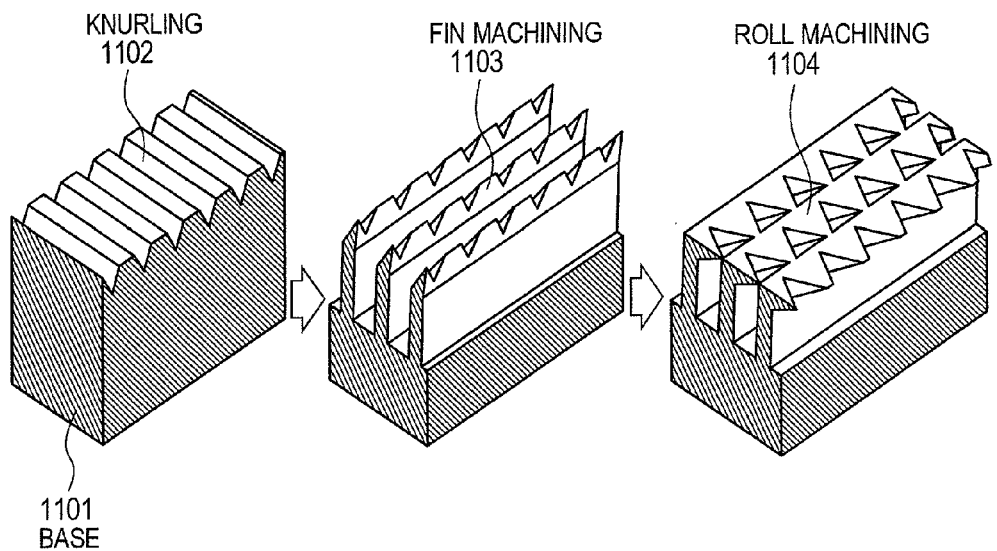
FIG. 11 is a perspective diagram including a partial cross section showing a procedure of generation of the boiling heat transfer surface.

As shown in FIG. 11, the above-described tunnel structure 1001 is formed as follows. In a base 1101 which is a metal plate, a surface is grooved by knurling 1102, then continuously subjected to harrowing into fins by fin machining 1103, and the ends of the fins are pressed by roll pressing 1104. That is, the ends of the fins are folded at right angle to the groove side with pressure from an upper position, thus the tunnel structure shown in the right part of FIG. 11 is obtained.

Figure 12:
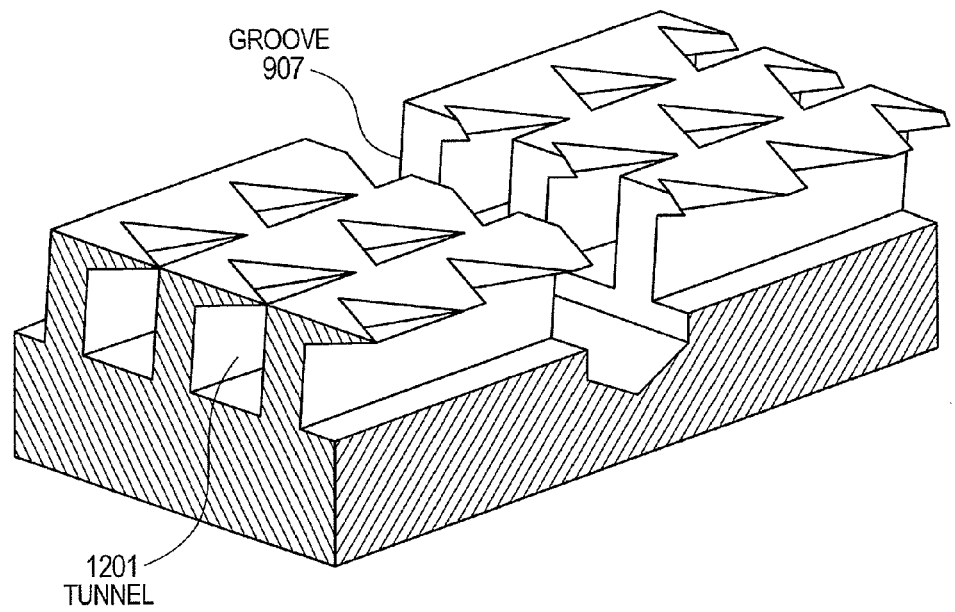
FIG. 12 is a perspective diagram including a partial cross section showing a more detailed structure of the boiling heat transfer surface.

FIG. 12 shows an enlarged view around the groove added at the center. In the boiling surface, a groove 1202, formed deeper than bottom surfaces of tunnels 1201 provided in parallel and adjacent to each other, is provided in an orthogonal direction to the tunnels 1201.

Figure 13:
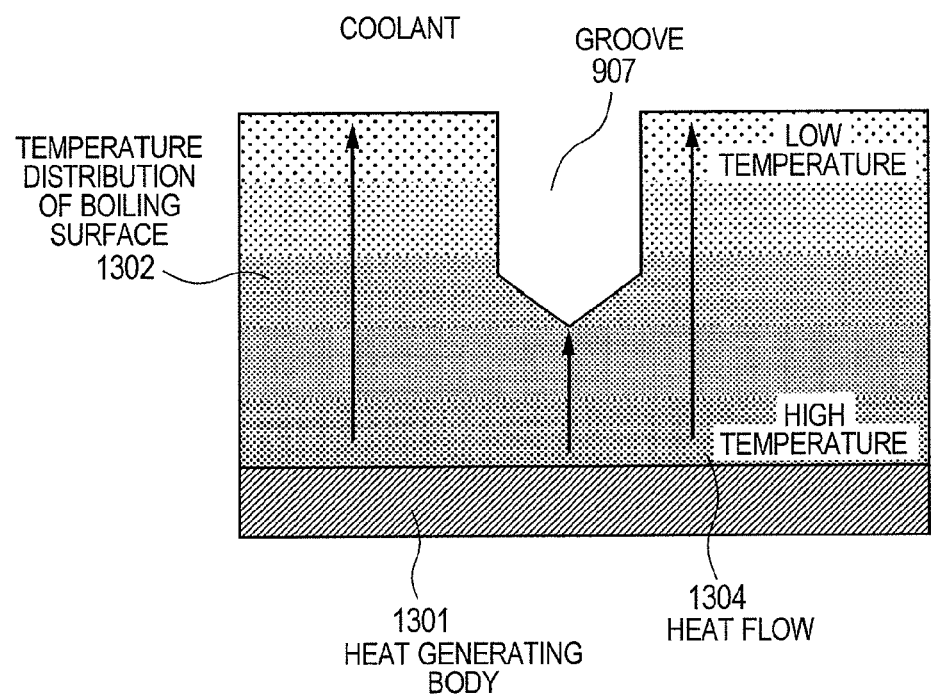
FIG. 13 is a cross-sectional diagram showing temperature distribution of the boiling heat transfer surface.

FIG. 13 shows a cross section of the boiling heat transfer unit with the groove 1202. When heat is transmitted from a heat generating body 1301 to the boiling heat transfer unit, temperature distribution 1302 of the cross section is higher in a position closer to the heat generating body, and lower in a position closer to the refrigerant side. Accordingly, it is possible to specifically increase the temperature of the boiling surface in a position with the groove 907 to a value higher than a uniform temperature of the boiling surface in a position without the groove 907. As described above, it is possible to promote the occurrence of bubbles as the start of boiling by forming a specifically high temperature position in the boiling surface. Further, as the temperature difference between the bottom of the groove 907 and the surface is increased by changing the depth of the groove 907, it is possible to control the promotion of the occurrence of bubbles.

Figure 5:
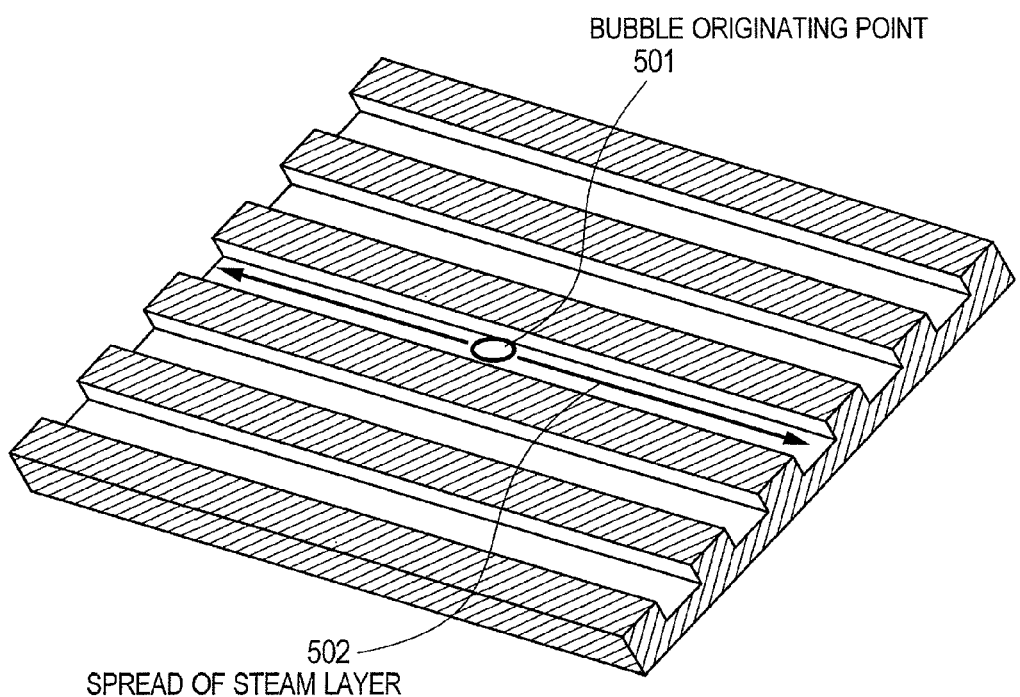
FIG. 5 is a perspective diagram including a partial cross section showing spread of steam layer in the boiling heat transfer surface having tunnel structure formed on a plane surface.
Figure 6:
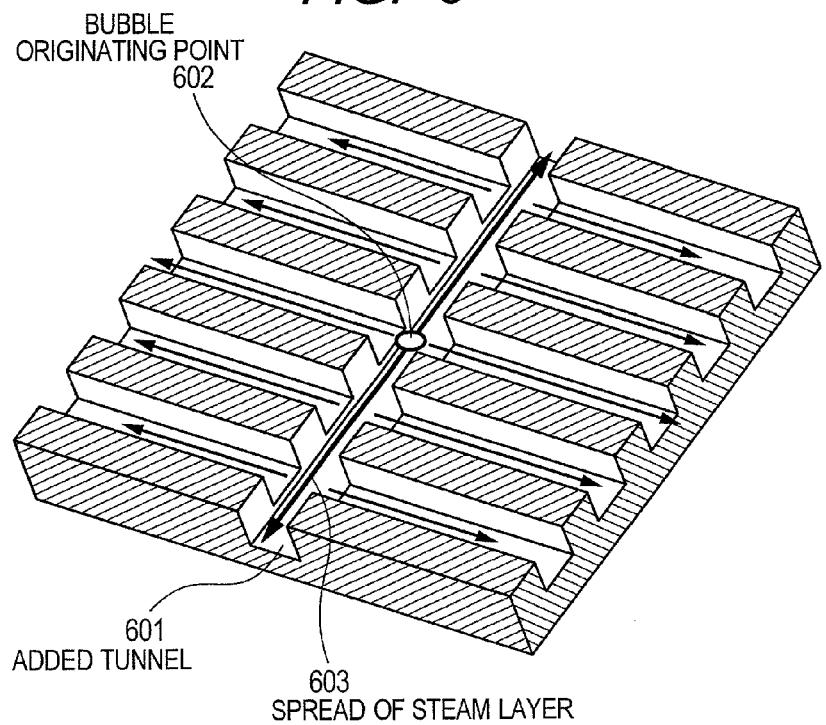
FIG. 6 is a perspective diagram including a partial cross section showing spread of the steam layer on the boiling heat transfer surface.

Further, in the conventional structure without the additional groove 907, even when initial bubbles occur, the bubbles are spread only in one tunnel as shown in FIG. 5. However, as the groove 907 and the cover plate 906 are newly provided as shown in FIG. 10, the new tunnel 601 is formed orthogonally to the parallel tunnels as shown in FIG. 6. The steam layer spreading from a bubble occurrence point 602 spreads in all the tunnels through the tunnel 601 as a bypass as indicated with reference numeral 603.

[Second Embodiment]

Figure 15:
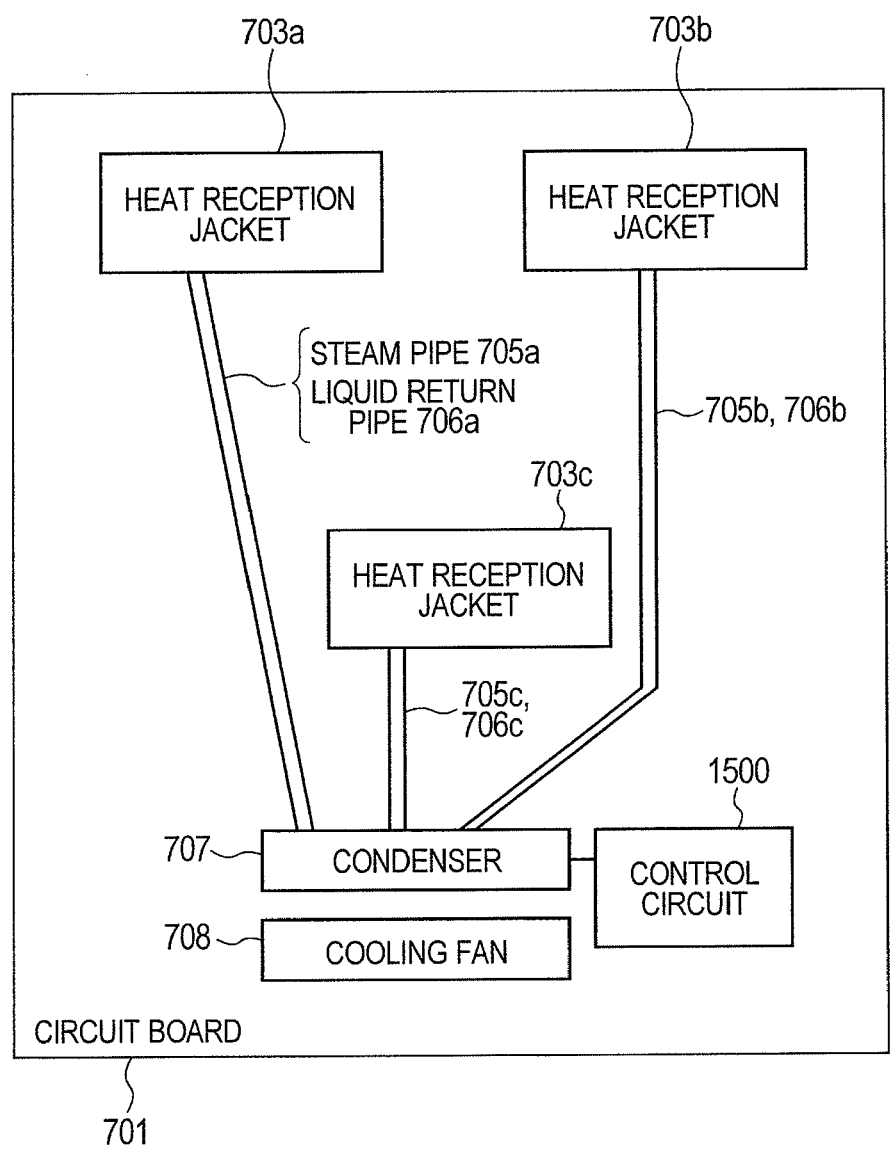
FIG. 15 is a block diagram showing a configuration of the boiling refrigerator type cooling system when plural semiconductor devices to be subjected to boiling refrigerant type cooling are provided on the same circuit board.

FIG. 15 shows a structure in a case where the structure of FIG. 7 is provided in plural positions on the circuit board. With respect to three semiconductor devices provided on a circuit board 701, heat reception jackets 703a to 703c are provided. Steam pipes 705a to 705c and liquid return pipes 706a to 706c are connected from the heat reception jackets 703a to 703 to a condenser 707 for heat exchange. The condenser 703 performs heat exchange with respect to the steam sent from the three heat reception jackets 703a to 703c. A cooling fan 708 is provided in the vicinity of the condenser 707 to promote the heat exchange. Further, in the steam pipes 705a to 705c, a sensor to detect steam pressure and steam temperature is provided at the exits on the condenser 707 side, and in the liquid return pipes 706a to 706c, a valve to control a liquid return amount is provided at the entrances on the condenser 707 side. In this case, it is possible to control the liquid return amount by controlling opening/closing of the respective valves in correspondence with degree of heat generation (steam generation amount) detected with the sensors in the respective semiconductor devices. The above control is performed with a control circuit 1500.

As a result, it is possible to perform appropriate boiling refrigerant type cooling by fully utilizing the limited amount of liquid refrigerant 704. Further, in comparison with a case where the condenser 707 is provided in the respective heat reception jackets 703a to 703c, the space for the condenser 707 can be saved.

In FIG. 15, the condenser 707, the cooling fan 708 and the control circuit 1500 for heat exchange are provided in a lower part of the figure. However, it is possible to appropriately select the positions of these elements in consideration of arrangement of parts on the circuit board 701 and the cooling effect.

As described above, in the boiling refrigerant type cooling system according to the present invention, it is possible to suppress overshoot upon start of boiling and realize stable start of boiling.

What is claimed is:

1. A boiling refrigerant type cooling system comprising:
a heat reception jacket, attached to a heat generating body provided on a circuit board, that vaporizes a liquid contained inside by heat from the heat generating body;
a condenser that receives steam from the heat reception jacket and transmits heat to the outside so as to condense the steam to the liquid;
a first pipe that conducts the steam from the heat reception jacket to the condenser; and
a second pipe that conducts the liquid from the condenser to the heat reception jacket,
wherein the heat reception jacket comprises a boiling heat transfer unit which contacts the liquid and is in thermal contact with the heat generating body, and
wherein the boiling heat transfer unit comprises:
a plurality of parallel tunnels under a surface, wherein the plurality of parallel tunnels communicate with the outside via gaps,
a groove formed through the plurality of parallel tunnels, wherein the groove is closer than the plurality of parallel tunnels to the heat generating body, and
a cover plate on the groove.

2. The boiling refrigerant type cooling system according to claim 1, wherein the groove is configured to be formed through the plurality of parallel tunnels in an orthogonal direction to the plurality of parallel tunnels.

3. The boiling refrigerant type cooling system according to claim 2,
wherein the groove is configured to be formed through middle of the boiling heat transfer unit.

4. A boiling refrigerant type cooling system comprising:
a heat reception jacket, attached to a heat generating body provided on a circuit board, which vaporizes a liquid contained inside by heat from the heat generating body;
wherein the heat reception jacket comprises a boiling heat transfer unit in thermal contact with the heat generating body, and
wherein the boiling heat transfer unit comprises:
a plurality of parallel tunnels, wherein the parallel tunnels communicate with the outside via gaps,
a groove formed through the plurality of parallel tunnels, wherein the groove is closer than the plurality of parallel tunnels to the heat generating body, and
a cover plate on the groove.

5. The boiling refrigerant type cooling system according to claim 4, wherein the groove is configured to be formed through the plurality of parallel tunnels in an orthogonal direction to the plurality of parallel tunnels.

6. A boiling refrigerant type cooling system comprising:
a heat reception jacket, attached to a heat generating body provided on a circuit board, which vaporizes a liquid contained inside by heat from the heat generating body;
wherein the heat reception jacket comprises a boiling heat transfer unit in thermal contact with the heat generating body, and
wherein the boiling heat transfer unit comprises:
a plurality of parallel tunnels, wherein the parallel tunnels communicate with the outside via gaps,
a groove formed through the plurality of parallel tunnels, and
a cover plate on the groove.

7. The boiling refrigerant type cooling system according to claim 6, wherein the groove is formed through the plurality of parallel tunnels in an orthogonal direction to the plurality of parallel tunnels.

* * * * *